(12) United States Patent
Jun et al.

(10) Patent No.: US 11,889,219 B2
(45) Date of Patent: Jan. 30, 2024

(54) ANALOG-TO-DIGITAL CONVERTING CIRCUIT FOR OPTIMIZING POWER CONSUMPTION OF DUAL CONVERSION GAIN OPERATION, OPERATION METHOD THEREOF, AND IMAGE SENSOR INCLUDING THE SAME

(71) Applicant: SAMSUNG ELECTRONICS CO., LTD., Suwon-si (KR)

(72) Inventors: Jaehoon Jun, Suwon-si (KR); Youngwoo Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/950,526

(22) Filed: Sep. 22, 2022

(65) Prior Publication Data
US 2023/0156371 A1    May 18, 2023

(30) Foreign Application Priority Data

Nov. 15, 2021 (KR) .......................... 10-2021-0156801
Apr. 28, 2022 (KR) .......................... 10-2022-0052606

(51) Int. Cl.
*H04N 25/772* (2023.01)
*H03M 1/82* (2006.01)

(52) U.S. Cl.
CPC .......... *H04N 25/772* (2023.01); *H03M 1/825* (2013.01)

(58) Field of Classification Search
None
See application file for complete search history.

(56) References Cited

U.S. PATENT DOCUMENTS

| 6,498,576 | B1 | 12/2002 | Tian et al. |
| 9,363,450 | B2 | 6/2016 | Nakamura et al. |
| 10,170,514 | B2 | 1/2019 | Meynants et al. |
| 10,194,106 | B2 | 1/2019 | Shim et al. |
| 10,397,500 | B1 | 8/2019 | Xu et al. |
| 10,431,608 | B2 | 10/2019 | Ebihara |
| 10,615,190 | B2 | 4/2020 | Ebihara |
| 10,735,676 | B2 | 8/2020 | Takane |
| 2020/0195870 | A1* | 6/2020 | Shim .................... H04N 25/771 |
| 2020/0236318 | A1 | 7/2020 | Okura |

* cited by examiner

*Primary Examiner* — Mark T Monk
(74) *Attorney, Agent, or Firm* — Sughrue Mion, PLLC (57) ABSTRACT

A circuit includes a comparator configured to generate a first conversion gain output signal by comparing a first pixel signal corresponding to a first conversion gain with a first ramp signal, and generate a second conversion gain output signal by comparing a second pixel signal corresponding to a second conversion gain with a second ramp signal, and a counter configured to count pulses of the first conversion gain output signal, output a counting result as a first digital signal, and determine whether an output of a second digital signal corresponding to the second conversion gain is required, based on the first digital signal. The first conversion gain is higher than the second conversion gain, and based on determining that the output of the second digital signal is not required, the counter is further configured to control the comparator such that the second conversion gain output signal is not generated.

20 Claims, 11 Drawing Sheets

ANALOG-TO-DIGITAL CONVERTING CIRCUIT FOR OPTIMIZING POWER CONSUMPTION OF DUAL CONVERSION GAIN OPERATION, OPERATION METHOD THEREOF, AND IMAGE SENSOR INCLUDING THE SAME

CROSS-REFERENCE TO RELATED APPLICATIONS

This application is based on and claims priority under 35 U.S.C. § 119 to Korean Patent Application No. 10-2021-0156801, filed on Nov. 15, 2021, and Korean Patent Application No. 10-2022-0052606, filed on Apr. 28, 2022, in the Korean Intellectual Property Office, the disclosures of which are incorporated by reference herein in their entireties.

BACKGROUND

1. Field

Example embodiments of the present disclosure relate to an analog-to-digital converter, and more particularly, to an analog-to-digital converting circuit for optimizing power consumption and an operation method thereof.

2. Description of Related Art

An image sensor includes a charge coupled device (CCD) image sensor, a complementary metal-oxide semiconductor (CMOS) image sensor (CIS), etc. The CMOS image sensor includes pixels composed of CMOS transistors and converts light energy into an electrical signal by using a photoelectric conversion element (or device) included in each pixel. The CMOS image sensor obtains information about a captured/photographed image by using the electrical signal generated by each pixel.

An analog-to-digital converter (ADC) receives an analog input voltage generated in a pixel and converts the received analog input voltage into a digital signal. The converted digital signal may be sent to other devices. The ADC may be used in various signal processing devices. As the performance of signal processing devices is improved, an improved resolution for an analog signal is required. As such, an ADC capable of processing many signals within the same time or providing an improved resolution for each signal is utilized. However, the above-described ADC causes an increase of power consumption.

SUMMARY

Provided are an analog-to-digital converting circuit for optimizing power consumption of a dual conversion gain operation such that power consumption is reduced, an operation method thereof, and an image sensor including the same, according to embodiments.

Various aspects of the embodiments will be set forth in part in the description which follows and, in part, will be apparent from the description, or may be learned by practice of the presented embodiments.

According to an aspect of an example embodiment, a circuit may include a comparator configured to generate a first conversion gain output signal by comparing a first pixel signal corresponding to a first conversion gain with a first ramp signal, and generate a second conversion gain output signal by comparing a second pixel signal corresponding to a second conversion gain with a second ramp signal, and a counter configured to count pulses of the first conversion gain output signal, output a counting result as a first digital signal, and determine whether an output of a second digital signal corresponding to the second conversion gain is required, based on the first digital signal. The first conversion gain may be higher than the second conversion gain, and based on determining that the output of the second digital signal is not required, the counter may be further configured to control the comparator such that the second conversion gain output signal is not generated.

According to an aspect of an example embodiment, a method of an analog-to-digital circuit may include generating a first conversion gain output signal by comparing a first pixel signal corresponding to a first conversion gain with a first ramp signal, counting pulses of the first conversion gain output signal, outputting a counting result as a first digital signal, determining whether an output of a second digital signal corresponding to a second conversion gain is required, based on the first digital signal, and based on determining that the output of the second digital signal is not required, allowing a second conversion gain output signal to not be generated. The first conversion gain may be higher than the second conversion gain.

According to an aspect of an example embodiment, an image sensor may include a pixel array configured to output a first pixel signal corresponding to a first conversion gain, and output a second pixel signal corresponding to a second conversion gain from pixels sharing a floating diffusion region, and an analog-to-digital converting circuit configured to convert the first pixel signal into a first digital signal and determine whether to convert the second pixel signal into a second digital signal, based on the first digital signal. The first conversion gain may be higher than the second conversion gain.

BRIEF DESCRIPTION OF THE DRAWINGS

The above and other aspects, features, and advantages of certain example embodiments of the present disclosure will be more apparent from the following description taken in conjunction with the accompanying drawings, in which.

DETAILED DESCRIPTION

Below, example embodiments of the present disclosure will be described in detail and clearly to such an extent that one skilled in the art easily carries out the present disclosure.

In the detailed description, components described with reference to the terms "unit", "module", "block", "~er or ~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

According to example embodiments, in the case of using an intra-scene dual conversion gain (iDCG), a pixel array may generate both a low conversion gain (LCG) pixel signal and a high conversion gain (HCG) pixel signal, and a signal with a higher SNR may be selectively applied for each pixel. The analog-to-digital (ADC) circuit performs both the digital conversion for an LCG pixel signal and the digital conversion for an HCG pixel signal. When a value of the HCG digital signal does not exceed a value of a given threshold code, the ADC may stop the comparison operation on the LCG pixel signal by taking advantage of the fact that the signal-to-noise ratio (SNR) of the LCG is superior to the SNR of the HCG when the amount of light is high. As such, the power consumption of the ADC circuit may decrease.

Figure 1:
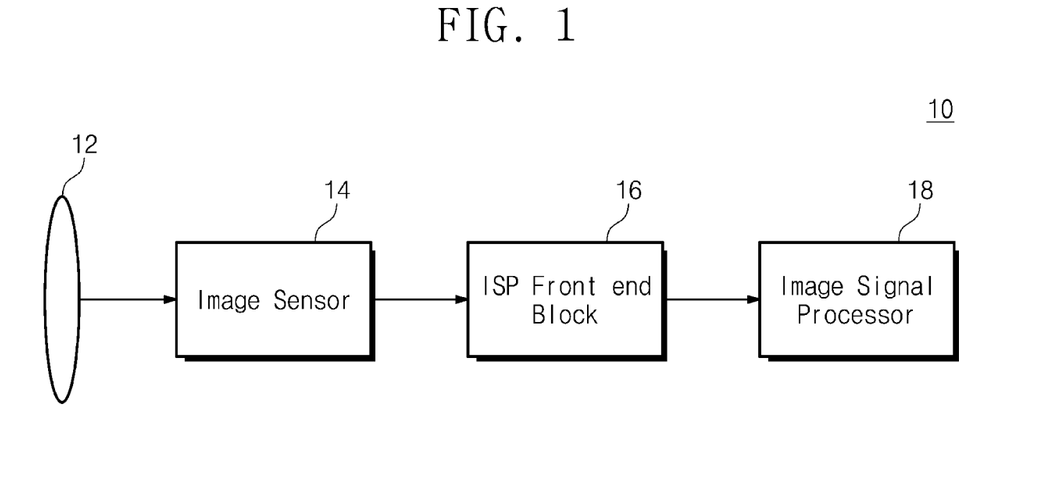
FIG. 1 is a diagram of an example of a configuration of an image processing block according to an example embodiment.

FIG. 1 is a diagram of an example of a configuration of an image processing block 10 according to an example embodiment. The image processing block 10 may be implemented as a part of various electronic devices such as a smartphone, a digital camera, a laptop computer, and a desktop computer. The image processing block 10 may include a lens 12, an image sensor 14, an image signal processor (ISP) front end block 16, and an ISP 18.

A light may be reflected from an object, a scenery, etc. targeted for photographing, and the lens 12 may receive the reflected light. The image sensor 14 may generate an electrical signal based on the light received through the lens 12. For example, the image sensor 14 may be implemented with a complementary metal-oxide semiconductor (CMOS) image sensor or the like. For example, the image sensor 14 may be a multi-pixel image sensor having a dual pixel structure or a tetracell structure.

The image sensor 14 may include a pixel array. Pixels of the pixel array may convert a light into electrical signals to generate pixel values. A ratio in which a light is converted into an electrical signal (e.g., a voltage) may be defined as "conversion gain". In particular, the pixel array may generate pixel signals under a low conversion gain condition and a high conversion gain condition, by using a change of the conversion gain, that is, a dual conversion gain.

In addition, the image sensor 14 may include an ADC circuit for performing a correlated double sampling (CDS) operation on the pixel values. A configuration of the image sensor 14 will be described in detail with reference to FIG. 2.

The ISP front end block 16 may perform pre-processing on an electrical signal output from the image sensor 14 so as to be appropriate for processing of the image signal processor 18. Also, the ISP front end block 16 of the present disclosure may selectively perform pre-processing for an electrical signal corresponding to the low conversion gain condition and pre-processing for an electrical signal corresponding to the high conversion gain condition, based on an output of the image sensor 14.

The ISP 18 may generate image data associated with the photographed object or scenery by appropriately processing the electrical signal processed by the ISP front end block 16. To this end, the ISP 18 may perform various processing operations such as color correction, auto white balance, gamma correction, color saturation correction, bad pixel correction, and hue correction.

One lens 12 and one image sensor 14 are illustrated in FIG. 1. However, in another embodiment, the image processing block 10 may include a plurality of lenses, a plurality of image sensors, and a plurality of ISP front end blocks. In this case, the plurality of lenses may have different fields of view. Also, the plurality of image sensors may have different functions, different performances, and/or different characteristics, and may respectively include pixel arrays of different configurations.

Figure 2:
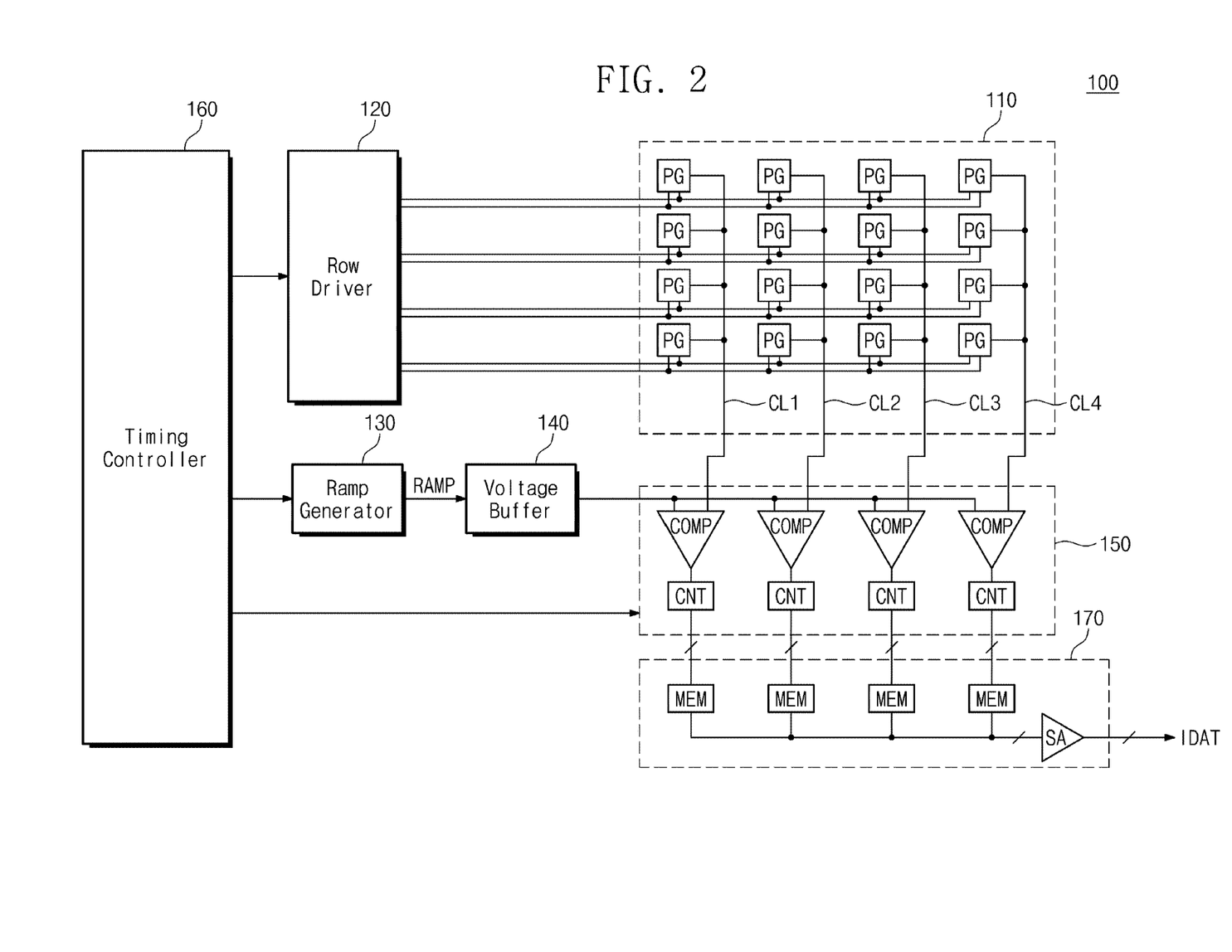
FIG. 2 is a diagram of an example of a configuration of an image sensor of FIG. 1 according to an example embodiment.

FIG. 2 is a diagram an example of a configuration of the image sensor 14 of FIG. 1 according to an example embodiment. An image sensor 100 may include a pixel array 110, a row driver 120, a ramp signal generator 130, a voltage buffer 140, an ADC circuit 150, a timing controller 160, and a buffer 170.

The pixel array 110 may include a plurality of pixels arranged along rows and columns in the form of a matrix. Each of the plurality of pixels may include a photoelectric conversion element (or device). For example, the photoelectric conversion element may include a photo diode, a photo transistor, a photo gate, a pinned photo diode, or the like.

The pixel array 110 may include a plurality of pixel groups PG. Each pixel group PG may include two or more pixels, that is, a plurality of pixels. A plurality of pixels constituting a pixel group PG may share one floating diffusion region or a plurality of floating diffusion regions. An example in which the pixel array 110 includes the pixel groups PG arranged in the form of a matrix with four rows and four columns (i.e., includes 4×4 pixel groups PG) is illustrated in FIG. 2. However, the present disclosure is not limited thereto.

The pixel group PG may include pixels of the same color. For example, the pixel group PG may include a red pixel to convert a light of a red spectrum into an electrical signal, a green pixel to convert a light of a green spectrum into an electrical signal, or a blue pixel to convert a light of a blue spectrum into an electrical signal. For example, the pixels constituting the pixel array 110 may be arranged in the form of a tetra-Bayer pattern.

The pixels of the pixel array 110 may output pixel signals through column lines CL1 to CL4, depending on the intensity or the amount of light received from the outside. For example, the pixel signal may be an analog signal corresponding to the intensity or the amount of light received from the outside.

As described with reference to FIG. 1, the pixel array 110 may generate pixel signals under the low conversion gain condition and the high conversion gain condition depending on ambient illuminance of an object. Herein, a pixel signal generated under the low conversion gain condition is referred to as a "low conversion gain condition pixel signal", and a pixel signal generated under the high conversion gain condition is referred to as a "high conversion gain condition pixel signal". For example, the pixel array 110 may first generate the high conversion gain pixel signal and may then generate the low conversion gain pixel signal. The pixel signals may pass through voltage buffers (e.g., source followers) and may then be provided to the ADC circuit 150 through the column lines CL1 to CL4. The pixel array 110 may change a conversion gain by turning on or turning off a dual conversion transistor, which will be described in detail with reference to FIGS. 3, 4A, and 4B.

The row driver 120 may select and drive a row of the pixel array 110. The row driver 120 may decode an address and/or a control signal generated by the timing controller 160 and may generate control signals for selecting and driving a row of the pixel array 110. For example, the control signals may include a signal for selecting a pixel, a signal for resetting a floating diffusion region, etc.

The ramp signal generator 130 may generate a ramp signal RAMP under control of the timing controller 160. For example, the ramp signal generator 130 may operate in response to a control signal such as a ramp enable signal. When the ramp enable signal is activated, the ramp signal generator 130 may generate the ramp signal RAMP depending on preset values (e.g., a start level, an end level, and a slope). In other words, the ramp signal RAMP may be a signal that increases or decreases along a preset slope during a specific time. The ramp signal RAMP may be provided to the ADC circuit 150 through the voltage buffer 140.

The ADC circuit 150 may receive pixel signals from a plurality of pixels through the column lines CL1 to CL4, and may receive the ramp signal RAMP from the ramp signal generator 130 through the voltage buffer 140. The ADC circuit 150 may operate based on a correlated double sampling (CDS) technique for obtaining a reset signal and an image signal from the received pixel signal and extracting a difference between the reset signal and the image signal as an effective signal component. In the case where the high conversion gain pixel signal is generated prior to the low conversion gain pixel signal, the ADC circuit 150 may first generate a high conversion gain digital signal prior to a low conversion gain digital signal. The ADC circuit 150 may include a plurality of comparators COMP and a plurality of counters CNT.

In detail, each of the comparators COMP may compare the reset signal of the pixel signal and the ramp signal RAMP, may compare the image signal of the pixel signal and the ramp signal RAMP, and may perform CDS on comparison results. Each of the counters CNT may count pulses of the signal experiencing the correlated double sampling and may output a counting result as a digital signal. Also, the counters CNT of the present disclosure may determine whether an output of the low conversion gain digital signal is required, based on the high conversion gain digital signal.

For example, when it is determined that the output of the low conversion gain digital signal is not required, the counters CNT may generate a power-down signal such that the comparators COMP do not perform the comparison operation on the low conversion gain pixel signal. As such, power consumption of the ADC circuit 150 may decrease. An example in which the ADC circuit 150 includes four comparators COMP and four counters CNT is illustrated in FIG. 2, but the present disclosure is not limited thereto.

The timing controller 160 may generate a control signal and/or a clock for controlling an operation and/or a timing of each of the row driver 120, the ramp signal generator 130, and the ADC circuit 150.

The buffer 170 may include memories MEMs and a sense amplifier SA. The memories MEM may store digital signals output from the corresponding counters CNT of the ADC circuit 150. The sense amplifier SA may sense and amplify the digital signals stored in the memories MEMs. The sense amplifier SA may output the amplified digital signals as image data IDAT, and the image data IDAT may be provided to the ISP front end block 16 of FIG. 1.

Figure 3:
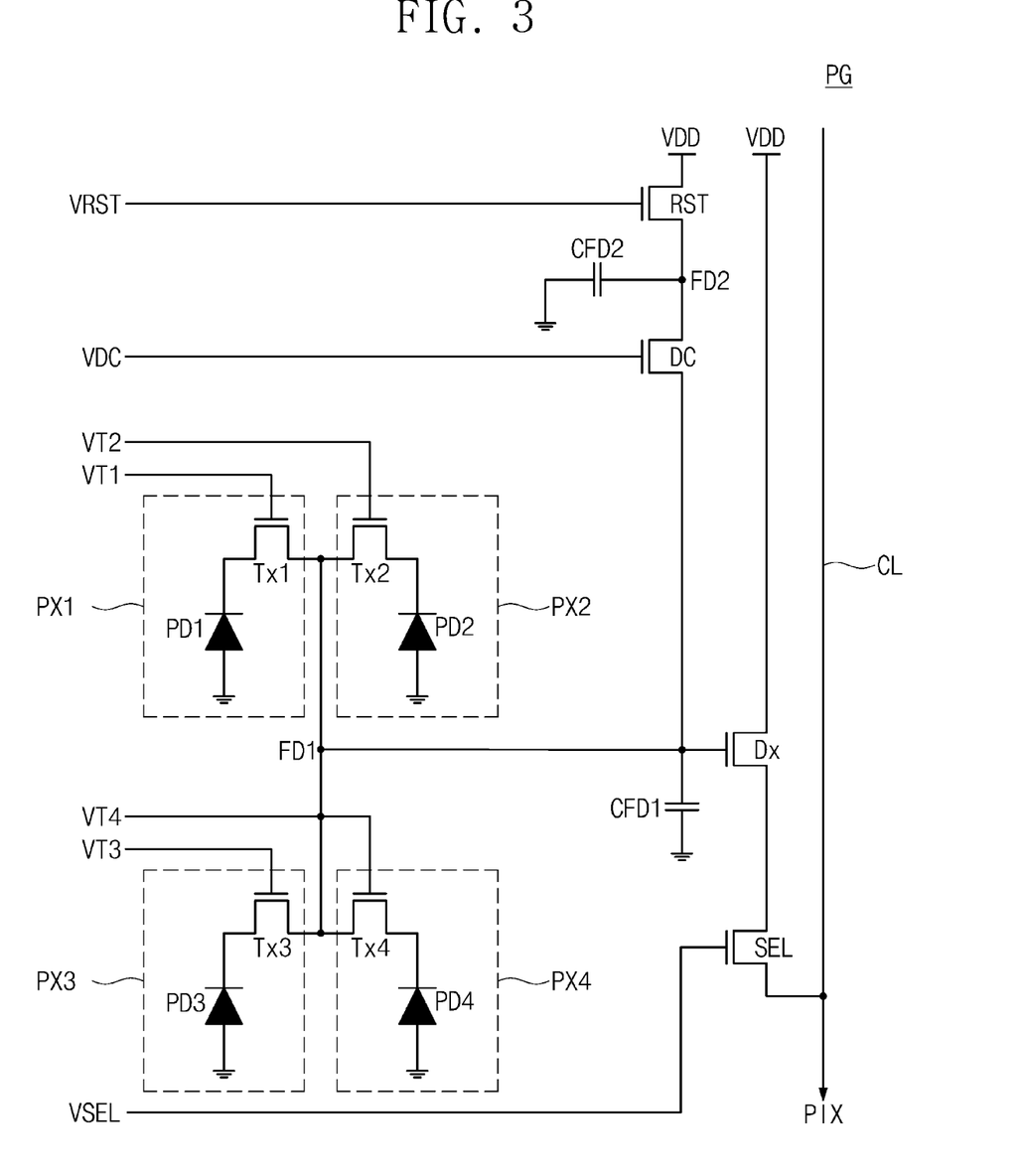
FIG. 3 is a circuit diagram illustrating an example of one among pixel groups of a pixel array of FIG. 2 according to an example embodiment.
Figure 4A:
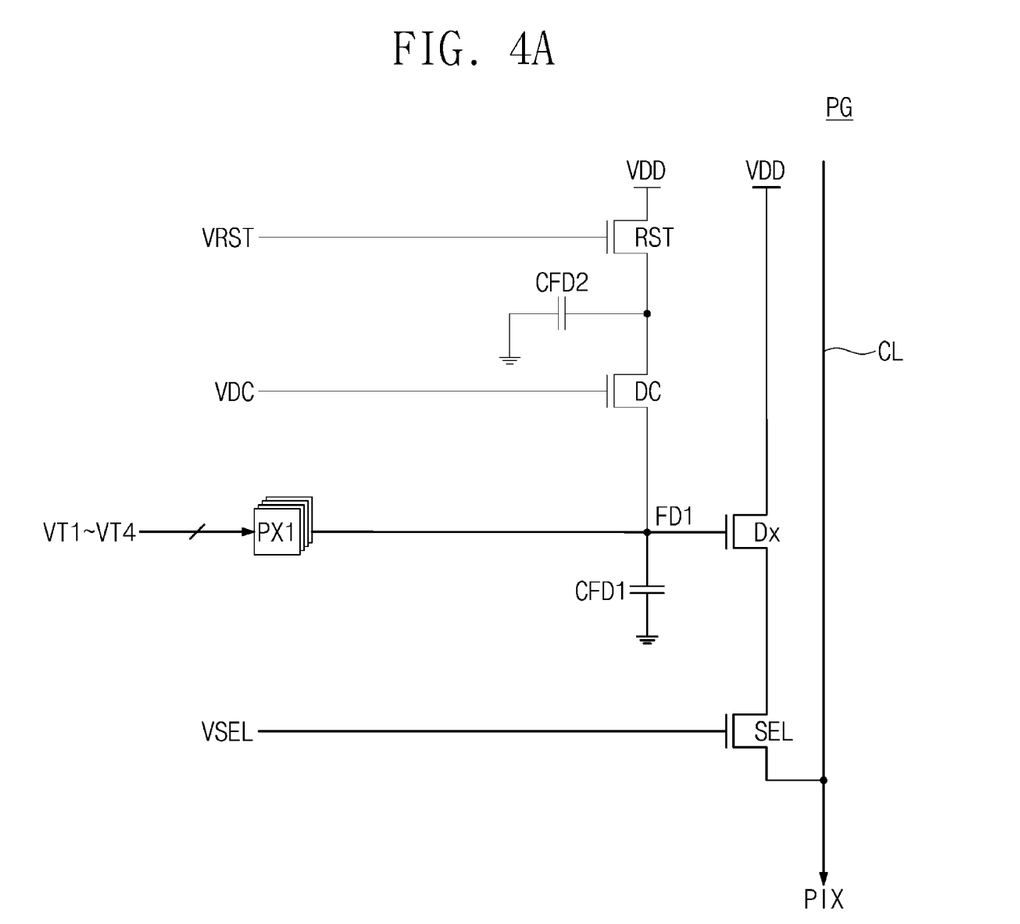
FIG. 4A is a circuit diagram illustrating a floating diffusion region under a high conversion gain condition in which a dual conversion transistor of FIG. 3 is turned off according to an example embodiment.
Figure 4B:
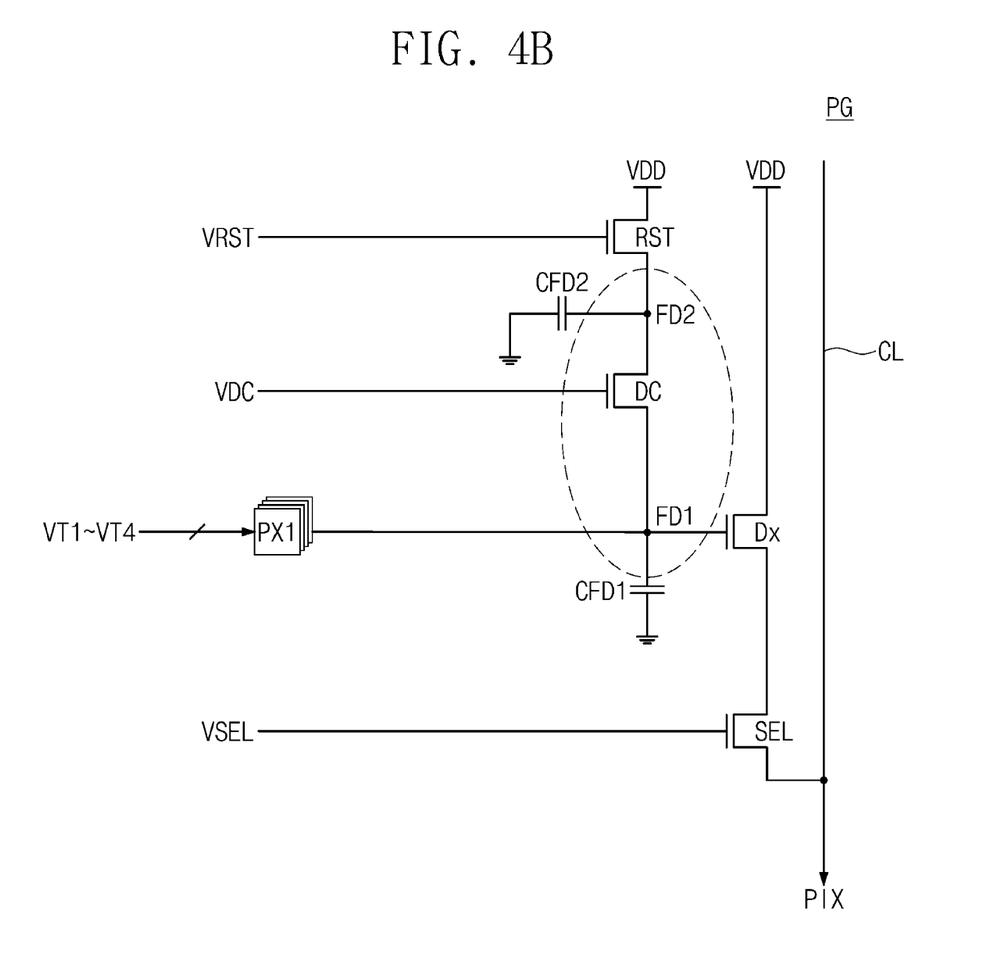
FIG. 4B is a circuit diagram illustrating a floating diffusion region under a low conversion gain condition in which a dual conversion transistor of FIG. 3 is turned on according to an example embodiment.

FIG. 3 is a circuit diagram illustrating an example of one of the pixel groups PG of the pixel array 110 of FIG. 2 according to an example embodiment. FIG. 4A is a circuit diagram illustrating a floating diffusion region FD1 under a high conversion gain condition in which a dual conversion transistor DC of FIG. 3 is turned off according to an example embodiment. FIG. 4B is a circuit diagram illustrating floating diffusion regions FD1 and FD2 under a low conversion gain condition in which the dual conversion transistor DC of FIG. 3 is turned on according to an example embodiment.

For example, the pixel group PG may include pixels PX1 to PX4, photoelectric conversion elements PD1 to PD4, transfer transistors Tx1 to Tx4, a reset transistor RST, the dual conversion transistor DC, a drive transistor Dx, and a select transistor SEL. An example in which the pixel group PG has a tetracell structure in which four pixels PX1 to PX4 include photoelectric conversion elements PD1 to PD4 respectively is illustrated in FIG. 3, but the present disclosure is not limited thereto. For example, the pixel group PG may be implemented to have various different structures.

The first pixel PX1 may include the first photoelectric conversion element PD1 and the first transfer transistor Tx1, and each of the remaining pixels PX2, PX3, and PX4 may also include similar components/elements. The pixels PX1 to PX4 may share the reset transistor RST, the dual conversion transistor DC, the drive transistor Dx, and the select transistor SEL. Also, the pixels PX1 to PX4 may share the first floating diffusion region FD1.

The first floating diffusion region FD1 or the second floating diffusion region FD2 may accumulate (or integrate) charges corresponding to the amount of incident light. While the transfer transistors Tx1 to Tx4 are respectively turned on by transfer signals VT1 to VT4, the first floating diffusion region FD1 or the second floating diffusion region FD2 may accumulate (or integrate) charges supplied from the photoelectric conversion elements PD1 to PD4. Because the first floating diffusion region FD1 is connected with a gate terminal of the drive transistor Dx operating as a source follower amplifier, a voltage corresponding to the amount of charges accumulated at the first floating diffusion region FD1 may be formed. For example, a capacitance of the first floating diffusion region FD1 is depicted as a first capacitance CFD1.

The dual conversion transistor DC may be driven by a dual conversion signal VDC. When the dual conversion transistor DC is turned off, the capacitance of the first floating diffusion region FD1 may correspond to the first capacitance CFD1. In a general environment, because the first floating diffusion region FD1 is not easily saturated, there is no need to increase the capacitance (i.e., CFD1) of the first floating diffusion region FD1. In this case, the dual conversion transistor DC may be turned off.

However, in a high-illuminance environment, the first floating diffusion region FD1 may be easily saturated. To prevent the saturation, the dual conversion transistor DC may be turned on such that the first floating diffusion region FD1 and the second floating diffusion region FD2 are electrically connected. In this case, a capacitance of the floating diffusion regions FD1 and FD2 may be increased to a sum of the first capacitance CFD1 and the second capacitance CFD2.

The transfer transistors Tx1 to Tx4 may be respectively driven by the transfer signals VT1 to VT4, and may transfer charges generated (or integrated) by the photoelectric conversion elements PD1 to PD4 to the first floating diffusion region FD1 or the second floating diffusion region FD2. For example, first ends of the transfer transistors Tx1 to Tx4 may be respectively connected with the photoelectric conversion elements PD1 to PD4, and second ends thereof may be connected in common with the first floating diffusion region FD1.

The reset transistor RST may be driven by a reset signal VRST and may provide a power supply voltage VDD to the first floating diffusion region FD1 or the second floating diffusion region FD2. As such, the charges accumulated at the first floating diffusion region FD1 or the second floating diffusion region FD2 may move to a terminal for the power supply voltage VDD, and a voltage of the first floating diffusion region FD1 or the second floating diffusion region FD2 may be reset.

The drive transistor Dx may amplify a voltage of the first floating diffusion region FD1 or the second floating diffusion region FD2 and may generate a pixel signal PIX corresponding to a result of the amplification. The select transistor SEL may be driven by a selection signal VSEL and may select pixels to be read in units of row. When the select transistor SEL is turned on, the pixel signal PIX may be output to the ADC circuit 150 of FIG. 2 through a column line CL.

Figure 5:
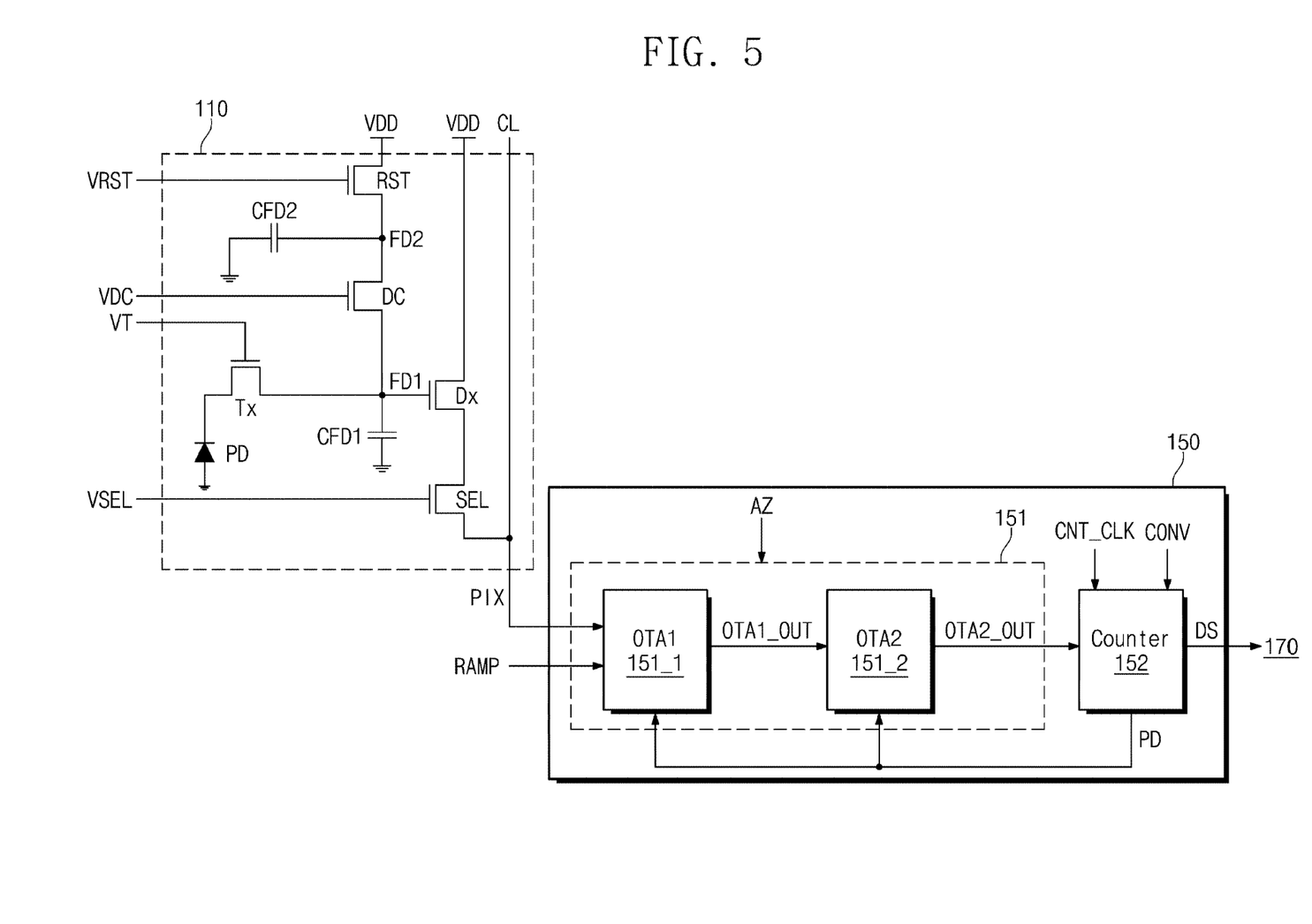
FIG. 5 is a diagram of an example of a configuration of an analog-to-digital converting (ADC) circuit of FIG. 2 according to an example embodiment.

FIG. 5 is a diagram of an example of a configuration of the ADC circuit 150 of FIG. 2 according to an example embodiment. The ADC circuit 150 may include a comparator 151 and a counter 152. The ADC circuit 150 may convert and output the pixel signal PIX being an analog signal output from the pixel array 110 into a digital signal DS. For clearness of description and brevity of drawing, an example in which the pixel array 110 includes only one pixel is illustrated in FIG. 5, and the configuration and function of the pixel array 110 are identical to those described with reference to FIG. 3.

In detail, as described with reference to FIG. 2, the comparator 151 may compare a reset signal of a pixel signal and the ramp signal RAMP, may compare an image signal of the pixel signal and the ramp signal RAMP, and may perform CDS on comparison results, and the counter 152 may count pulses of a signal experiencing the CDS and may output a counting result as a digital signal. FIG. 5 will be described with reference to FIGS. 2, 3, 4A, and 4B.

For example, the comparator 151 may have a two-stage structure including two amplifiers (i.e., a first amplifier 151_1 and a second amplifier 151_2), and each of the first amplifier 151_1 and the second amplifier 151_2 may be implemented as an operational transconductance amplifier (OTA). However, the present disclosure is not limited thereto. For example, the comparator 151 may have a structure including a more number of amplifiers. Also, the ADC circuit 150 may include a plurality of comparators and a plurality of counters, but one comparator 151 and one counter 152 are illustrated in FIG. 5 for clearness of description.

The first amplifier 151_1 may receive the pixel signal PIX from the pixel array 110 through the column line CL, and may receive the ramp signal RAMP from the ramp signal generator 130 through the voltage buffer 140. The first amplifier 151_1 may output a first output signal OTA1_OUT based on the received signals. For example, in a period where a level of the ramp signal RAMP is higher than a level of the pixel signal PIX, the first amplifier 151_1 may output the first output signal OTA1_OUT having a high level; in a period where the level of the ramp signal RAMP is lower than the level of the pixel signal PIX, the first amplifier 151_1 may output the first output signal OTA1_OUT having a low level. Also, the comparison operation of the first amplifier 151_1 described above may be performed both when the reset signal of the pixel signal PIX and the ramp signal RAMP are compared and when the image signal of the pixel signal PIX and the ramp signal RAMP are compared.

The second amplifier 151_2 may amplify the first output signal OTA1_OUT to output a second output signal OTA2_OUT being a comparison signal. For example, the second output signal OTA2_OUT may be an inverted version of the first output signal OTA1_OUT. In other words, the second amplifier 151_2 may output the second output signal OTA2_OUT having the low level during the high level of the first output signal OTA1_OUT and may output the second output signal OTA2_OUT having the high level during the low level of the first output signal OTA1_OUT.

In the following description, that a voltage level of the first output signal OTA1_OUT or the second output signal OTA2_OUT transitions from the high level to the low level or from the low level to the high level as the comparator 151 performs the comparison operation may be referred to as "decision of the ADC circuit 150". In other words, "after the decision of the circuit 150 ends" may mean "after a voltage level of the first output signal OTA1_OUT or the second output signal OTA2_OUT changes from the high level to the low level or from the low level to the high level". In an auto-zero period before the comparison operation is performed, the comparator 151 may be initialized in response to an auto-zero signal AZ and may then again perform the comparison operation.

The counter 152 may operate under control of the timing controller 160, may count pulses of the second output signal OTA2_OUT, and may output a counting result as the digital signal DS. For example, the counter 152 may operate in response to control signals such as a counter clock signal CNT_CLK and an inversion signal CONV for inverting an internal bit of the counter 152.

For example, the counter 152 may include an up/down counter, a bit-wise inversion counter, etc. An operation of the bit-wise counter may be similar to an operation of the up/down counter. For example, the bit-wise counter may perform a function of performing up-counting only and a function of converting all internal bits of a counter to obtain the 1's complement when a specific signal is input thereto. The bit-wise counter may perform a reset count, and may then invert a reset counting result so as to be converted into the 1's complement, that is, a negative value.

Also, the counter 152 of the present disclosure may determine whether an output of the low conversion gain digital signal is required, based on a high conversion gain digital signal. When it is determined that the output of the low conversion gain digital signal is not required, the counter 152 may generate a power-down signal PD such that the comparator 151 does not perform the comparison operation on the low conversion gain pixel signal.

The counter 152 may send the power-down signal PD to the comparator 151 (i.e., the first amplifier 151_1 or the second amplifier 151_2). The first amplifier 151_1 or the second amplifier 151_2 may not generate the first output signal OTA1_OUT or the second output signal OTA2_OUT corresponding to the low conversion gain condition in response to the power-down signal PD. As such, power consumption of the pixel array 110 or the ADC circuit 150 may decrease. For example, the first amplifier 151_1 and the second amplifier 151_2 may include a power-down switch (e.g., an NMOS transistor or a PMOS transistor) that operates in response to the power-down signal PD.

Figure 6A:
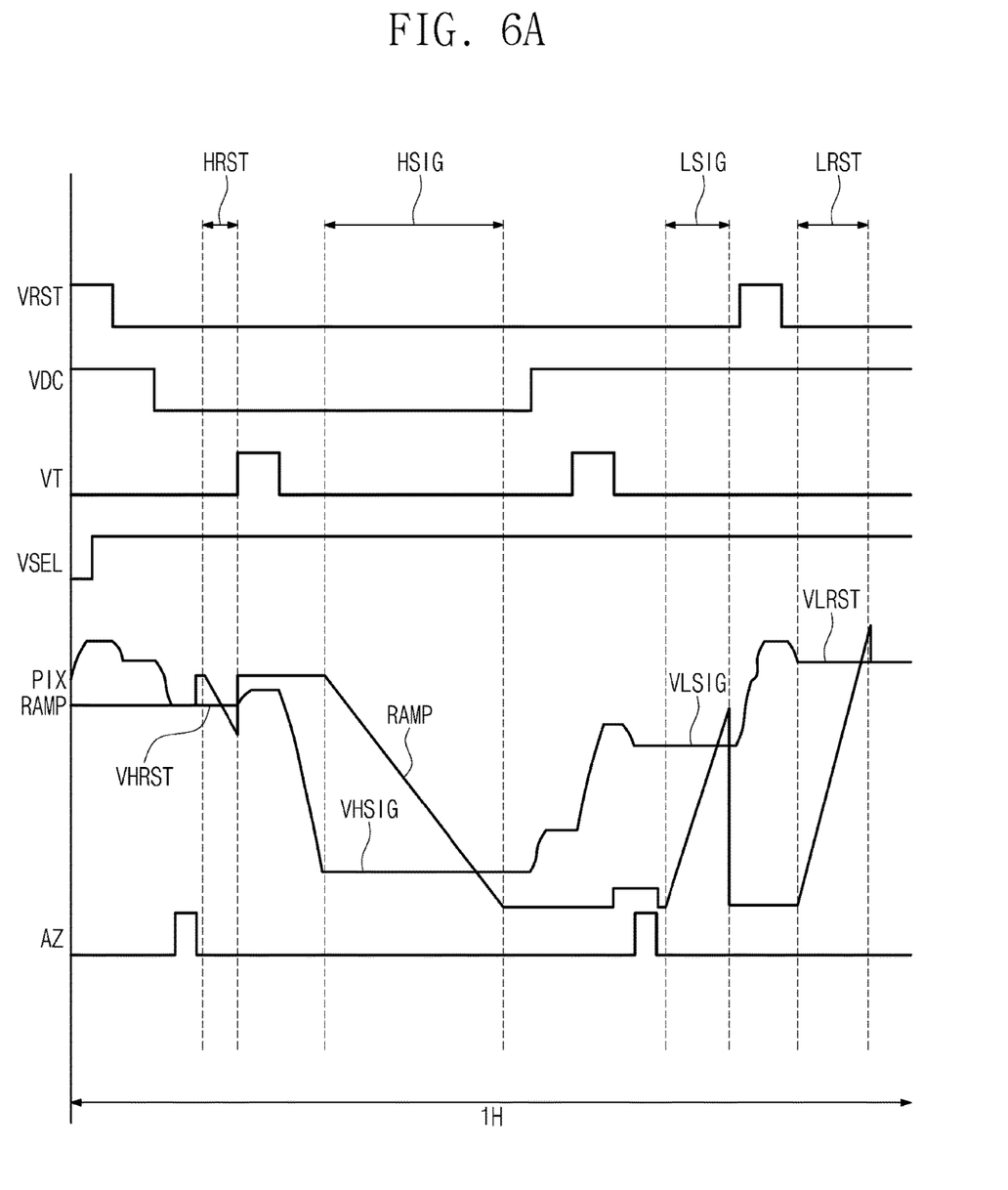
FIG. 6A is a timing diagram illustrating a process in which an ADC circuit of FIG. 5 processes a pixel signal depending on a reset-sig-sig-reset (RSSR) method according to an example embodiment.
Figure 6B:
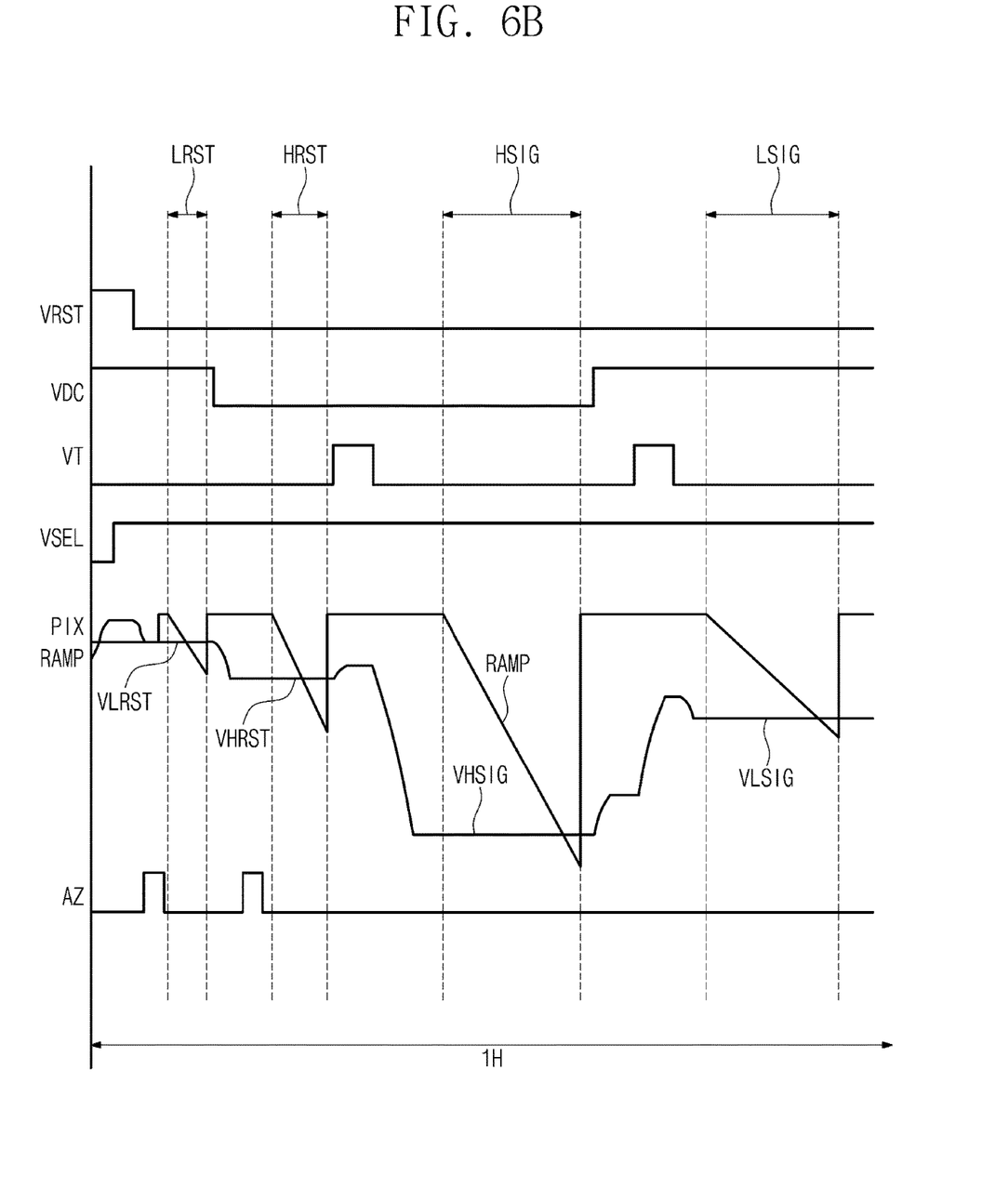
FIG. 6B is a timing diagram illustrating a process in which an ADC circuit of FIG. 5 processes a pixel signal depending on a reset-reset-sig-sig (RRSS) method according to an example embodiment.

FIG. 6A is a timing diagram illustrating a process in which the ADC circuit 150 of FIG. 5 processes the pixel signal PIX depending on a reset-sig-sig-reset (RSSR) method according to an example embodiment. FIG. 6B is a timing diagram illustrating a process in which the ADC circuit 150 of FIG. 5 processes the pixel signal PIX depending on a reset-reset-sig-sig (RRSS) method according to an example embodiment. Below, FIGS. 6A and 6B will be described together with FIG. 5.

A 1H time period is illustrated in FIGS. 6A and 6B. The 1H time period may refer to a time that should be essentially secured to drive a plurality of pixels of the pixel array 110 in units of row. For example, the 1H time period may include a high conversion gain reset signal period HRST, a high conversion gain image signal period HSIG, a low conversion gain reset signal period LRST, and a low conversion gain image signal period LSIG.

Referring to FIG. 6A, the high conversion gain reset signal period HRST, the high conversion gain image signal period HSIG, the low conversion gain image signal period LSIG, and the low conversion gain reset signal period LRST may progress sequentially (RSSR).

A high conversion gain reset signal VHRST, a high conversion gain image signal VHSIG, a low conversion gain image signal VLSIG, and a low conversion gain reset signal VLRST may be respectively output in the plurality of periods HRST, HSIG, LSIG, and LRST as components of the pixel signal PIX, so as to be sequentially converted into digital signals.

First, the reset signal VRST of a logic high level is applied to a gate of the reset signal VRST and the reset signal VRST of a logic low level is then applied to the gate of the reset signal VRST. Next, the adjustment between a voltage level of the ramp signal RAMP and a voltage level of the pixel signal PIX may be made in response to the auto-zero signal AZ. Then, the dual conversion signal VDC of the logic low level may be applied to a gate of the dual conversion transistor DC, and thus, the high conversion gain reset signal VHRST may be output in the high conversion gain reset signal period HRST. Afterwards, a transfer signal VT of the logic high level may be applied to a gate of the transfer transistor Tx, and thus, the high conversion gain image signal VHSIG may be output in the high conversion gain image signal period HSIG.

Next, the adjustment between a voltage level of the ramp signal RAMP and a voltage level of the pixel signal PIX may be made in response to the again auto-zero signal AZ. As the reset signal VRST of the logic low level is applied to the gate of the reset transistor RST, the dual conversion signal VDC of the logic high level is applied to the gate of the dual conversion transistor DC, and the transfer signal VT of the logic high level is applied to the gate of the transfer transistor Tx, the low conversion gain image signal VLSIG may be output in the low conversion gain image signal period LSIG. Afterwards, the reset signal VRST of the logic high level may be applied to the gate of the reset transistor RST, and thus, the low conversion gain reset signal VLRST may be output in the low conversion gain reset signal period LRST.

Under the condition that the ADC circuit 150 processes the pixel signal PIX depending on the RSSR method as illustrated in FIG. 6A, when it is determined by the counter 152 that the output of the low conversion gain digital signal is not required, the operation of the comparator 151 may be stopped in response to the power-down signal PD after the high conversion gain image signal period HSIG ends. As such, the low conversion gain image signal period LSIG and the low conversion gain reset signal period LRST may be omitted. This may mean that power consumption of the ADC circuit 150 decreases.

Referring to FIG. 6B, the low conversion gain reset signal period LRST, the high conversion gain reset signal period HRST, high conversion gain image signal period HSIG, and the low conversion gain image signal period LSIG may progress sequentially (RRSS).

First, the reset signal VRST of the logic high level is applied to the gate of the reset signal VRST and the reset signal VRST of the logic low level is then applied to the gate of the reset signal VRST. Next, the adjustment between a voltage level of the ramp signal RAMP and a voltage level of the pixel signal PIX may be made in response to the auto-zero signal AZ. Then, the dual conversion signal VDC of the logic high level may be applied to the gate of the dual conversion transistor DC, and thus, the low conversion gain reset signal VLRST may be output in the low conversion gain reset signal period LRST. After the adjustment between the voltage level of the ramp signal RAMP and the voltage level of the pixel signal PIX is again made in response to the auto-zero signal AZ, the dual conversion signal VDC of the logic low level may be applied to the gate of the dual conversion transistor DC, and thus, the high conversion gain reset signal VHRST may be output in the high conversion gain reset signal period HRST.

Afterwards, the transfer signal VT of the logic high level may be applied to the gate of the transfer transistor Tx, and thus, the high conversion gain image signal VHSIG may be output in the high conversion gain image signal period HSIG. As the dual conversion signal VDC of the logic high level is applied to the gate of the dual conversion transistor DC and the transfer signal VT of the logic high level is applied to the gate of the transfer transistor Tx, the low conversion gain image signal VLSIG may be output in the low conversion gain image signal period LSIG.

Under the condition that the ADC circuit 150 processes the pixel signal PIX depending on the RRSS method as illustrated in FIG. 6B, when it is determined by the counter 152 that the output of the low conversion gain digital signal is not required, the operation of the comparator 151 may be stopped in response to the power-down signal PD after the high conversion gain image signal period HSIG ends. As such, the low conversion gain image signal period LSIG may be omitted. This may mean that power consumption of the ADC circuit 150 decreases.

Figure 7:
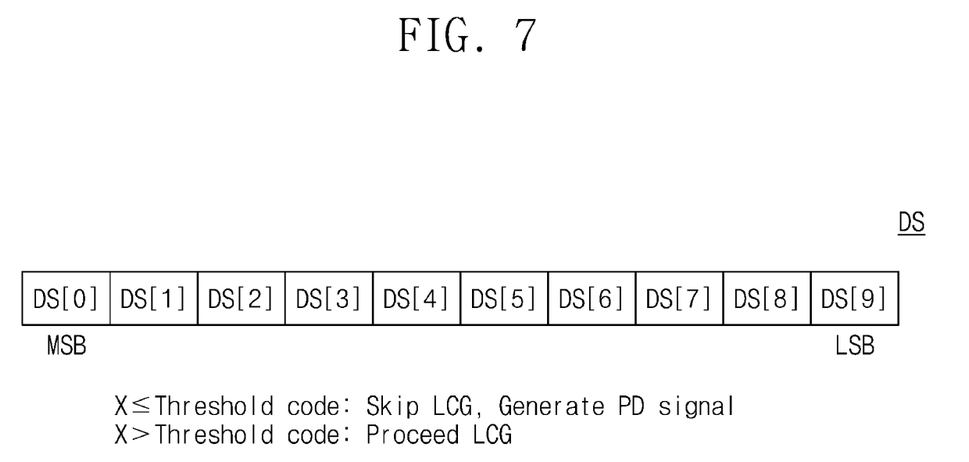
FIG. 7 is a diagram of an example of a high conversion gain digital signal according to an example embodiment.

FIG. 7 is a diagram of an example of the high conversion gain digital signal DS. FIG. 7 will be described together with FIG. 5 according to an example embodiment.

Referring to FIG. 7, the digital signal DS may be a 10-bit signal, that is, may include 10 bits DS[0] to DS[9]. Herein, DS[0] is a most significant bit (MSB), and DS[9] is a least significant bit (LSB). The counter 152 may monitor the digital signal DS and may calculate a value "X" of upper bits. For example, the counter 152 may calculate only a value of the MSB DS[0], or may calculate a value of the 0-th to second bits DS[0] to DS[2] However, the present disclosure is not limited thereto. For example, the counter 152 may calculate the value "X" of upper bits in a method different from the above method.

Afterwards, the counter 152 may compare the value "X" of upper bits with a value of a preset threshold code. When the value "X" of upper bits is smaller than or equal to the value of the preset threshold code (X≤Threshold code), the counter 152 may determine that the output of the low conversion gain digital signal is not required, and may generate the power-down signal PD. As described with reference to FIG. 5, the power-down signal PD may be provided to the comparator 151 (i.e., the first amplifier 151_1 or the second amplifier 151_2). In this case, the comparator 151 may not perform the comparison operation on the low conversion gain pixel signal (e.g., the operations in the low conversion gain image signal period LSIG and the low conversion gain reset signal period LRST of FIGS. 6A and 6B), and thus, power consumption of the ADC circuit 150 may decrease.

When the value "X" of upper bits is greater than the value of the preset threshold code (X>Threshold code), the counter 152 may determine that the output of the low conversion gain digital signal is required, and may not generate the power-down signal PD. In this case, the comparator 151 may continuously perform the comparison operation on the low conversion gain pixel signal (e.g., the operations in the low conversion gain image signal period LSIG and the low conversion gain reset signal period LRST of FIGS. 6A and 6B).

Figure 8:
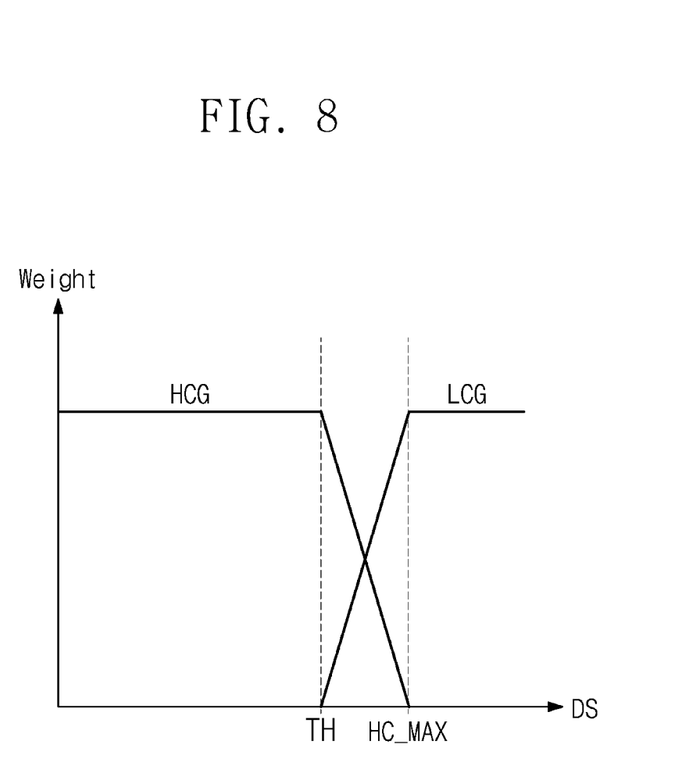
FIG. 8 is a diagram of weights of a high conversion gain pixel signal and a low conversion gain pixel signal in image data according to a value of a high conversion gain digital signal according to an example embodiment.

FIG. 8 is a diagram of weights of a high conversion gain pixel signal and a low conversion gain pixel signal in image data according to a value of the high conversion gain digital signal DS according to an example embodiment. For example, it is assumed that a value of the digital signal DS is expressed through a value of upper bits, as described with reference to FIG. 7. In FIG. 8, "TH" represents a value of a threshold code, and "HC_MAX" represents a maximum value that the high conversion gain digital signal DS is capable of having. FIG. 8 will be described with reference to FIGS. 5 and 7.

Referring to FIG. 8, a zone in which both the high conversion gain pixel signal and the low conversion gain pixel signal participates in the generation of image data is only a zone in which a value of the digital signal DS is between TH and HC_MAX. For example, the zone may correspond to an intermediate illuminance zone between low illuminance and high illuminance. When illuminance is higher than the intermediate illuminance zone (i.e., when a value of the digital signal DS reaches HC_MAX), only the low conversion gain pixel signal may be used. When illuminance is lower than the intermediate illuminance zone (i.e., when a value of the digital signal DS is smaller than or equal to TH), only the high conversion gain pixel signal may be used.

In other words, when a value of the high conversion gain digital signal DS is smaller than or equal to TH, because the low conversion gain pixel signal does not participate in the generation of image data, that the output of the low conversion gain digital signal is not required may be determined by the counter 152. In this case, as the power-down signal PD is provided to the comparator 151 (i.e., the first amplifier 151_1 or the second amplifier 151_2), the comparison operation associated with the low conversion gain pixel signal (e.g., the operations in the low conversion gain image signal period LSIG and the low conversion gain reset signal period LRST of FIGS. 6A and 6B) may not be performed, and thus, power consumption of the ADC circuit 150 may decrease.

That is, the counter 152 may determine whether the low conversion gain digital signal is required by monitoring a value of the high conversion gain digital signal DS in real time, and may control the operation of the comparator 151 based on a determination result. Alternatively, in some cases, it may be possible to fail to stop the comparison operation associated with the low conversion gain pixel signal. In this case, even though the low conversion gain digital signal is generated, the ISP front end block 16 of FIG. 1 may not perform pre-processing on the low conversion gain digital signal.

Figure 9:
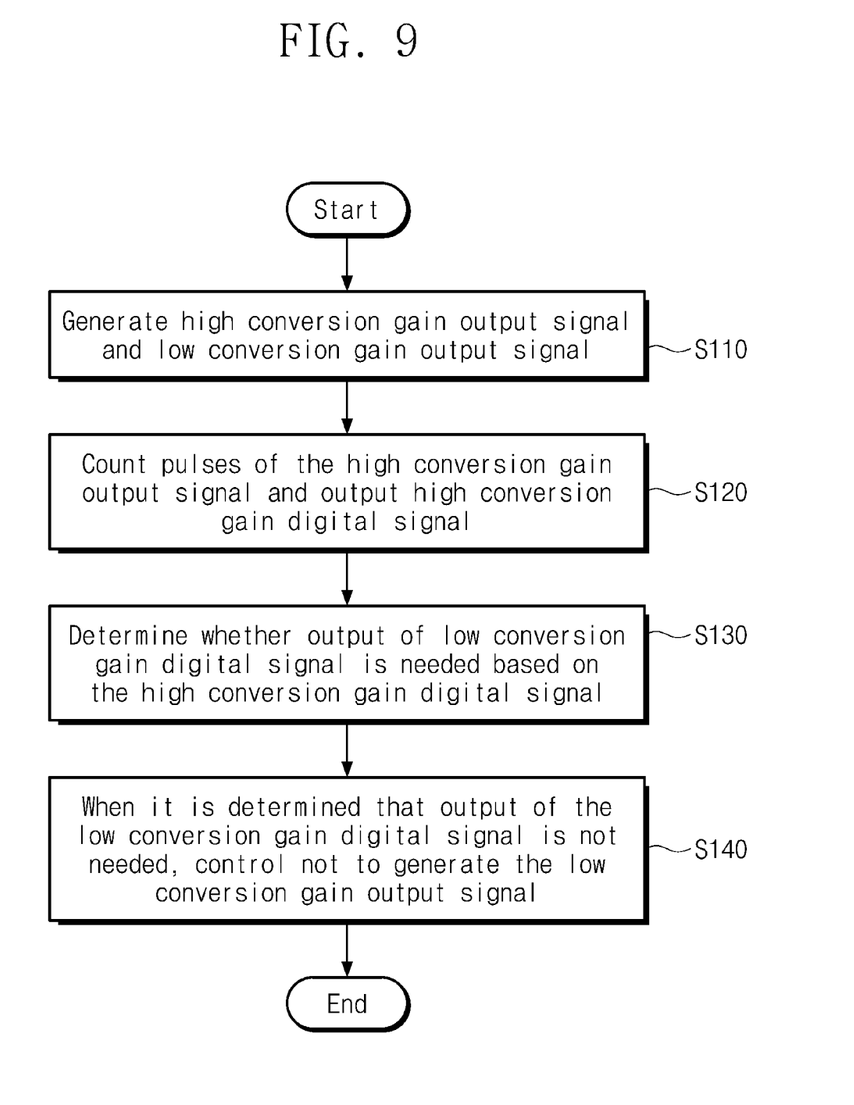
FIG. 9 is a flowchart illustrating an operation method of an ADC circuit for optimizing power consumption of a dual conversion gain operation according to an example embodiment.

FIG. 9 is a flowchart illustrating an operation method of an ADC circuit for optimizing power consumption of a dual conversion gain operation according to an example embodiment. FIG. 9 will be described with reference to FIG. 5.

In operation S110, the comparator 151 may compare a high conversion gain pixel signal and a ramp signal to generate a high conversion gain output signal corresponding to a high conversion gain condition, and may compare a low conversion gain pixel signal and the ramp signal to generate a low conversion gain output signal corresponding to a low conversion gain condition. In operation S120, the counter 152 may count pulses of the high conversion gain output signal and may output a counting result as a high conversion gain digital signal.

In operation S130, the counter 152 may determine whether the output of the low conversion gain digital signal is required, based on the high conversion gain digital signal. In detail, the counter 152 may compare a value of the high conversion gain digital signal (e.g., a value of upper bits of the high conversion gain digital signal) and a value of a preset threshold code. When it is determined that the output of the low conversion gain digital signal is not required, in operation S140, the counter 152 may allow the comparator 151 not to generate the low conversion gain output signal.

According to an embodiment of the present disclosure, power consumption of a dual conversion gain operation may be optimized by determining whether a low conversion gain operation is required, based on an output feedback of a counter. Also, according to an embodiment of the present disclosure, power consumption of an analog-to-digital converting circuit may decrease.

At least one of the components, elements, modules or units (collectively "components" in this paragraph) represented by a block in the drawings such as FIGS. 1, 2 and 5 may be embodied as various numbers of hardware, software and/or firmware structures that execute respective functions described above. At least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above example embodiments may be implemented in algorithms that execute on one or more processors. Furthermore, the components represented by a block or processing steps may employ any number of related art techniques for electronics configuration, signal processing and/or control, data processing and the like.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A circuit comprising:
    a comparator configured to:
        generate a first conversion gain output signal by comparing a first pixel signal corresponding to a first conversion gain with a first ramp signal; and
        generate a second conversion gain output signal by comparing a second pixel signal corresponding to a second conversion gain with a second ramp signal; and
    a counter configured to:
        count pulses of the first conversion gain output signal,
        output a counting result as a first digital signal, and
        determine whether an output of a second digital signal corresponding to the second conversion gain is required, based on the first digital signal,
    wherein the first conversion gain is higher than the second conversion gain, and
    wherein, based on determining that the output of the second digital signal is not required, the counter is further configured to control the comparator such that the second conversion gain output signal is not generated.

2. The circuit of claim 1, wherein, based on a value of the first digital signal being less than or equal to a value of a preset threshold code, the counter is configured to determine that the output of the second digital signal is not required.

3. The circuit of claim 2, wherein the value of the first digital signal is determined based on a value of a most significant bit (MSB) thereof.

4. The circuit of claim 1, wherein the comparator is further configured to:
    compare a reset signal of the first pixel signal with the first ramp signal in a first operating period;
    compare an image signal of the first pixel signal with the first ramp signal in a second operating period;
    compare an image signal of the second pixel signal with the second ramp signal in a third operating period; and
    compare a reset signal of the second pixel signal with the second ramp signal in a fourth operating period,
    wherein, based on determining that the output of the second digital signal is not required, the comparing in the third operating period and the comparing in the fourth operating period are not performed.

5. The circuit of claim 1, wherein the comparator is further configured to:
    compare a reset signal of the second pixel signal with the second ramp signal in a first operating period;
    compare a reset signal of the first pixel signal with the first ramp signal in a second operating period;
    compare an image signal of the first pixel signal with the first ramp signal in a third operating period; and
    compare an image signal of the second pixel signal with the second ramp signal in a fourth operating period, and
    wherein, based on determining that the output of the second digital signal is not required, the comparing in the fourth operating period is not performed.

6. A method of an analog-to-digital converting circuit, the method comprising:
    generating a first conversion gain output signal by comparing a first pixel signal corresponding to a first conversion gain with a first ramp signal;
    counting pulses of the first conversion gain output signal;
    outputting a counting result as a first digital signal;
    determining whether an output of a second digital signal corresponding to a second conversion gain is required, based on the first digital signal; and
    based on determining that the output of the second digital signal is not required, allowing a second conversion gain output signal not to be generated,
    wherein the first conversion gain is higher than the second conversion gain.

7. The method of claim 6, wherein the determining whether the output of the second digital signal corresponding to the second conversion gain is required comprises:
    comparing a value of the first digital signal with a value of a preset threshold code; and
    based on the value of the first digital signal being less than or equal to the value of the preset threshold code, determining that the output of the second digital signal is not required.

8. The method of claim 7, wherein the comparing of the value of the first digital signal with the value of the preset threshold code comprises:
    comparing a value of a most significant bit (MSB) of the first digital signal with the value of the preset threshold code.

9. The method of claim 6, wherein the generating of the first conversion gain output signal comprises:
    comparing a reset signal of the first pixel signal with the first ramp signal in a first operating period; and
    comparing an image signal of the first pixel signal with the first ramp signal in a second operating period.

10. The method of claim 6, wherein the generating of the first conversion gain output signal comprises:
    comparing a reset signal of a second pixel signal with a second ramp signal in a first operating period;
    comparing a reset signal of the first pixel signal with the first ramp signal in a second operating period; and
    comparing an image signal of the first pixel signal with the first ramp signal in a third operating period.

11. An image sensor comprising:
    a pixel array configured to:
        output a first pixel signal corresponding to a first conversion gain; and
        output a second pixel signal corresponding to a second conversion gain from pixels sharing a floating diffusion region; and
    an analog-to-digital converting circuit configured to:
        convert the first pixel signal into a first digital signal; and
        determine whether to convert the second pixel signal into a second digital signal, based on the first digital signal,
    wherein the first conversion gain is higher than the second conversion gain.

12. The image sensor of claim 11, wherein the first pixel signal corresponds to charges stored at the floating diffusion region having a first capacitance value, and
wherein the second pixel signal corresponds to charges stored at the floating diffusion region having a second capacitance value.

13. The image sensor of claim 12, wherein the pixel array comprises a capacitor connected with the floating diffusion region and configured to obtain the second capacitance value.

14. The image sensor of claim 11, wherein the analog-to-digital converting circuit comprises:
a comparator configured to:
generate a first conversion gain output signal by comparing the first pixel signal with a first ramp signal; and
generate a second conversion gain output signal by comparing the second pixel signal with a second ramp signal; and
a counter configured to:
count pulses of the first conversion gain output signal;
output a counting result as the first digital signal; and
determine whether an output of the second digital signal is required, based on the first digital signal.

15. The image sensor of claim 14, wherein, based on determining that the output of the second digital signal is not required, the counter controls the comparator such that the second conversion gain output signal is not generated.

16. The image sensor of claim 15, wherein the counter is further configured to generate a power-down signal and send the power-down signal to the comparator, and
wherein the comparator is further configured to stop an operation of comparing the second pixel signal and the second ramp signal in response to the power-down signal.

17. The image sensor of claim 15, wherein, based on a value of the first digital signal being less than or equal to a value of a preset threshold code, the counter determines that the output of the second digital signal is not required.

18. The image sensor of claim 17, wherein the value of the first digital signal is determined based on a value of a most significant bit (MSB) thereof.

19. The image sensor of claim 14, wherein the comparator is further configured to:
compare a reset signal of the first pixel signal with the first ramp signal in a first operating period;
compare an image signal of the first pixel signal with the first ramp signal in a second operating period;
compare an image signal of the second pixel signal with the second ramp signal in a third operating period; and
compare a reset signal of the second pixel signal with the second ramp signal in a fourth operating period, and
wherein, based on determining that the output of the second digital signal is not required, the comparing in the third operating period and the comparing in the fourth operating period are not performed.

20. The image sensor of claim 14, wherein the comparator is further configured to:
compare a reset signal of the second pixel signal with the second ramp signal in a first operating period;
compare a reset signal of the first pixel signal with the first ramp signal in a second operating period;
compare an image signal of the first pixel signal with the first ramp signal in a third operating period; and
compare an image signal of the second pixel signal with the second ramp signal in a fourth operating period, and
wherein, based on determining that the output of the second digital signal is not required, the comparing in the fourth operating period is not performed.

* * * * *